United States Patent
Hsia et al.

(10) Patent No.: US 11,209,849 B1
(45) Date of Patent: Dec. 28, 2021

(54) DYNAMIC TRACKING REGULATOR TO PROTECT RADIATION-HARDENED DEVICES

(71) Applicants: Timothy T. Hsia, Irvine, CA (US); Victor K. Lee, Irvine, CA (US)

(72) Inventors: Timothy T. Hsia, Irvine, CA (US); Victor K. Lee, Irvine, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 62 days.

(21) Appl. No.: 16/563,023

(22) Filed: Sep. 6, 2019

(51) Int. Cl.
*G05F 1/575* (2006.01)
*G05F 1/625* (2006.01)

(52) U.S. Cl.
CPC ............. *G05F 1/575* (2013.01); *G05F 1/625* (2013.01)

(58) Field of Classification Search
CPC .... H02M 3/156; H02M 3/33507; H02M 1/08; H02M 1/008; H02M 3/335; H02M 3/003; H02M 3/33561; H02M 3/33569; H02M 3/3376; H02M 7/103; H02M 3/33523; H02M 1/0006; H02M 1/0064; H02M 1/0095; H02M 1/34; H02M 1/342; H02M 1/348; H02M 1/40; H02M 3/158; H02M 3/285; H02M 3/33553; H02M 7/4837; G05F 1/575; H02H 7/10; H02J 7/35; H02J 1/00; H02J 4/00; H02J 50/15; H02J 50/20; H02J 7/00034; H02J 7/0044; B64G 1/428; B64G 1/10; B64G 1/405; B64G 1/52; B64G 1/1007; B64G 1/1085; B64G 1/222; B64G 1/244; B64G 1/36; B64G 1/40; B64G 1/401; B64G 1/402; B64G 1/403; B64G 1/42; B64G 1/425; B64G 1/443; B64G 1/46; B64G 1/54; B64G 1/546; B64G 1/66; B64G 2700/66
See application file for complete search history.

(56) References Cited

U.S. PATENT DOCUMENTS 4,999,552 A * 3/1991 Seipelt ................. H02H 7/0833
                                                          318/434
5,305,192 A * 4/1994 Bonte ............... H02M 3/33507
                                                          323/285

(Continued)

*Primary Examiner* — Gustavo A Rosario-Benitez
(74) *Attorney, Agent, or Firm* — Tarolli, Sundheim, Covell & Tummino LLP

(57) ABSTRACT

A circuit includes a regulation module having a threshold input to receive a clamp threshold voltage and a feedback input to monitor a swing-limited output voltage. The regulation module generates a difference signal that indicates a difference between the clamp threshold voltage and the swing-limited output voltage. A current compensation module includes a clamp port and an input port. The clamp port to controls the swing-limited output voltage and the input port receives the difference signal. The clamp port generates an adjustment current to control the swing-limited output voltage based on the difference signal. An adjustment network receives an input voltage and the adjustment current from the clamp port. The adjustment current to generate a voltage across the adjustment network such that the swing-limited output voltage at the clamp port is adjusted within a voltage range of the input voltage.

20 Claims, 9 Drawing Sheets

(56) References Cited

U.S. PATENT DOCUMENTS

| | | | | |
|---|---|---|---|---|
| 5,422,562 A * | 6/1995 | Mammano | H02M 3/156 | 323/282 |
| 5,508,603 A * | 4/1996 | Strong, III | G05F 1/613 | 323/234 |
| 5,672,918 A * | 9/1997 | Kimbrough | H02H 5/005 | 307/126 |
| 6,975,172 B2 * | 12/2005 | Craynon | H03F 1/0233 | 330/297 |
| 8,072,266 B1 * | 12/2011 | Hoomes | H03F 1/025 | 330/251 |
| 9,665,113 B2 * | 5/2017 | Ciubotaru | G05F 1/575 | |
| 9,753,473 B2 * | 9/2017 | Tan | G05F 1/575 | |
| 9,793,707 B2 * | 10/2017 | Torres | G05F 1/5735 | |
| 9,966,837 B1 * | 5/2018 | Seaton | H02M 1/08 | |
| 2006/0104095 A1 * | 5/2006 | Summer | H02M 3/335 | 363/37 |
| 2007/0024263 A1 * | 2/2007 | Yang | G05F 1/575 | 323/315 |
| 2007/0159146 A1 * | 7/2007 | Mandal | G05F 1/575 | 323/280 |
| 2009/0033298 A1 * | 2/2009 | Kleveland | G05F 1/575 | 323/271 |
| 2009/0174385 A1 * | 7/2009 | Yen | H02M 1/36 | 323/288 |
| 2009/0289720 A1 * | 11/2009 | Takinami | G05F 1/565 | 330/297 |
| 2011/0148388 A1 * | 6/2011 | Zanchi | G11C 27/026 | 323/313 |
| 2012/0197447 A1 * | 8/2012 | Fossion | G06F 11/3648 | 700/286 |
| 2013/0234684 A1 * | 9/2013 | Chang | G05F 1/468 | 323/281 |
| 2013/0241644 A1 * | 9/2013 | Chen | H03F 1/0238 | 330/135 |
| 2017/0115678 A1 * | 4/2017 | Qing | G05F 1/575 | |
| 2017/0115680 A1 * | 4/2017 | Zhou | G05F 1/575 | |
| 2018/0048232 A1 * | 2/2018 | Adell | H03L 7/085 | |
| 2018/0120876 A1 * | 5/2018 | Petenyi | H03F 3/45071 | |
| 2018/0281994 A1 * | 10/2018 | De Payrebrune | H02S 40/30 | |
| 2019/0052110 A1 * | 2/2019 | Liu | G05F 1/56 | |
| 2019/0079551 A1 * | 3/2019 | Tourret | G05F 1/571 | |
| 2020/0004281 A1 * | 1/2020 | Chao | H03F 3/2178 | |
| 2020/0004284 A1 * | 1/2020 | Harada | G05F 1/59 | |
| 2020/0133324 A1 * | 4/2020 | Nagata | H03F 3/45273 | |
| 2021/0103306 A1 * | 4/2021 | Hwang | G05F 3/245 | |

* cited by examiner

DYNAMIC TRACKING REGULATOR TO PROTECT RADIATION-HARDENED DEVICES

GOVERNMENT INTEREST

The invention was made under Government Contract. Therefore, the US Government has rights to the invention as specified in that contract.

TECHNICAL FIELD

This disclosure relates to amplifier circuits, and more particularly to a dynamic tracking regulator to protect radiation-hardened devices.

BACKGROUND

Radiation hardening includes designing and producing electronic components and systems that are resistant to damage or malfunctions caused by ionizing radiation (e.g., particle radiation and high-energy electromagnetic radiation). Such radiation, for example, may be encountered in outer space and high-altitude flight. Most semiconductor electronic components are susceptible to radiation damage, however radiation-hardened component designs are based on their non-hardened equivalents, with some design and manufacturing variations that reduce the susceptibility to radiation damage. Due to the extensive development and testing required to produce a radiation-tolerant design of a microelectronic chip for example, radiation-hardened chips tend to lag behind the most recent technological developments. Radiation-hardened components are typically tested to one or more resultant effects tests, including total ionizing dose (TID), enhanced low dose rate effects (ELDRS), neutron and proton displacement damage, and single event effects (SEE).

In an example application, a radiation-hardened by design (RHBD) device utilizes thin-oxide transistors (e.g., 1.8V) at the differential input of a comparator and/or amplifier. This can present a problem for an integrated circuit (IC) chip that employs the respective comparator or amplifier yet runs on higher supply rail (e.g., 5V) than the RHBD device. Thus, these radiation-hardened thin-oxide devices can be damaged if their junction voltages exceed the factory specified maximum rating for the device. Also, limiting the input-range of the comparator or amplifier to a lower voltage supported by the RHBD device can significantly reduce the dynamic range of the entire IC that employs such devices and thus, lower the overall performance of the associated radiation-hardened design.

SUMMARY

This disclosure relates to a tracking regulator module to control input range swings for radiation-hardened devices. In one aspect, a circuit includes a regulation module having a threshold input to receive a clamp threshold voltage and a feedback input to monitor a swing-limited output voltage. The regulation module generates a difference signal that indicates a difference between the clamp threshold voltage and the swing-limited output voltage. A current compensation module includes a clamp port and an input port. The clamp port to controls the swing-limited output voltage and the input port receives the difference signal. The clamp port generates an adjustment current to control the swing-limited output voltage based on the difference signal. An adjustment network receives an input voltage and the adjustment current from the clamp port. The adjustment current to generate a voltage across the adjustment network such that the swing-limited output voltage at the clamp port is adjusted within a voltage range of the input voltage.

In another aspect, a circuit includes an integrated circuit (IC) that includes a radiation hardened by design (RHBD) device having a device input. The RHBD device is operatively coupled to the IC and operates at a device voltage (VDEV) that is less than an operating voltage (VDD) of the IC. A first tracking regulator module having a threshold input receives a clamp threshold voltage and a feedback input to monitor a swing-limited output voltage. The first tracking regulator module generates a difference signal that indicates a difference between the clamp threshold voltage and the swing-limited output voltage. The first tracking regulator module includes a clamp port and an input port. The clamp port controls the swing-limited output voltage and the input port receives the difference signal. The clamp port generates an adjustment current to control the swing-limited output voltage based on the difference signal. An adjustment network receives an input voltage and the adjustment current from the clamp port. The adjustment current generates a voltage across the adjustment network such that the swing-limited output voltage at the clamp port is adjusted within a voltage range of the input voltage.

In yet another aspect, a system includes an integrated circuit (IC) that includes a radiation hardened by design (RHBD) device having a device input, the RHBD device is operatively coupled to the IC and operates at a device voltage (VDEV) that is less than an operating voltage (VDD) of the IC. A first tracking regulator module having a first clamp port controls a swing-limited output voltage and a first input port coupled to receive a first difference signal that indicates a difference between an input voltage and a threshold voltage. The first clamp port generates an adjustment sink current to control the swing-limited output voltage based on the first difference signal indicating the input voltage is detected above the threshold voltage. A second tracking regulator module having a second clamp port controls the swing-limited output voltage and a second input port coupled to receive a second difference signal that indicates a difference between the input voltage and the threshold voltage. The second clamp port generates an adjustment source current to control the swing-limited output voltage based on the second difference signal indicating the input voltage is detected below the threshold voltage. An adjustment network receives the input voltage and the adjustment current from the first clamp port and the second clamp port. The adjustment current generates a voltage across the adjustment network such that the swing-limited output voltage at the first clamp port and the second clamp port is adjusted within a voltage range of the input voltage.

DETAILED DESCRIPTION

Figure 1:
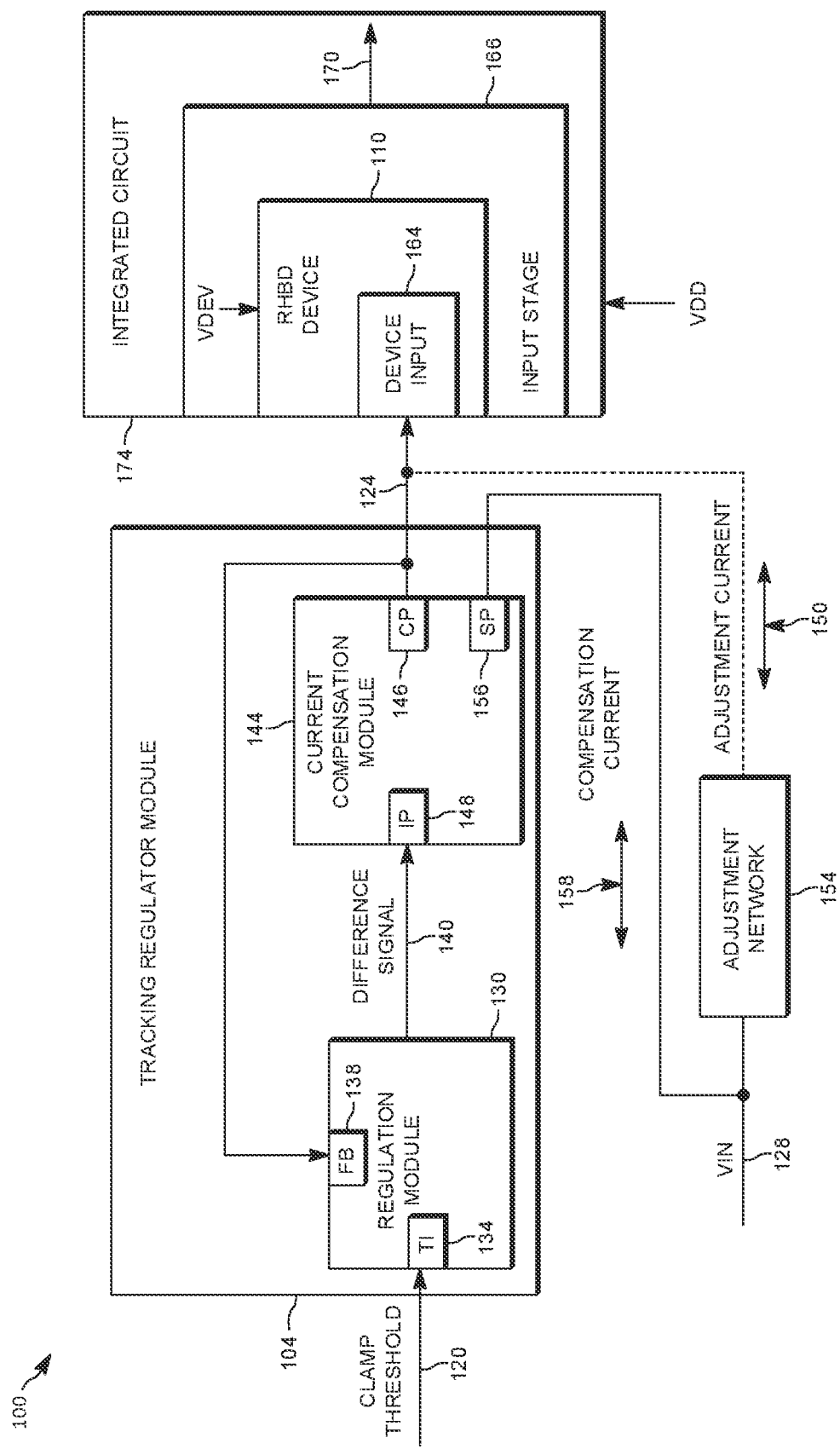
FIG. 1 illustrates a block diagram of an example circuit that employs a tracking regulator module and adjustment network to limit input range swings to a radiation hardened by design device.

This disclosure relates to a dynamic tracking regulator module to control input range swings for radiation-hardened by design (RHBD) devices that operate at lower voltages and are employed at an input stage of an integrated circuit (IC) chip operating at higher voltages. The tracking regulator module includes a regulation module having a threshold input to receive a clamp threshold voltage and a feedback input to monitor a swing-limited output voltage. The clamp threshold voltage sets a voltage at which the swing-limited output voltage is to be set (e.g., within a given voltage range of the threshold). The regulation module generates a difference signal that indicates a difference between the clamp threshold voltage and the swing-limited output voltage. In some examples, the difference signal may indicate the difference above the threshold whereas in other examples, the difference signal may indicate the difference below the clamp threshold voltage. A current compensation module in the tracking regulator module includes a clamp port and an input port. The clamp port to controls the swing-limited output voltage and the input port receives the difference signal from the regulation module. The clamp port generates an adjustment current to control the swing-limited output voltage based on the difference signal. The current compensation module can also provide compensation current back to an input voltage source to mitigate loading by the clamping action of the tracking regulator module.

An adjustment network receives an input voltage and the adjustment current from the clamp port. The adjustment current is used to generate a voltage across the adjustment network such that the swing-limited output voltage at the clamp port is adjusted within a voltage range of the input voltage. The voltage across the adjustment network can add or subtract to the input voltage such that the swing-limited output voltage is held with in a suitable range to protect the RHBD device. The tracking regulator module described herein uses adjustment current rather than voltage to control the swing-limited output voltage. In existing designs, excessive current loads are required at the output of the regulator to allow for suitable regulation. The RHBD devices described herein provide high impedance loads and thus draw negligible current which do not support an existing voltage regulator approach. Therefore, the tracking regulator modules described herein monitors voltage differences to determine a difference signal yet generates an adjustment current output to regulate the swing-range of the swing-limited output voltage.

The tracking regulator module dynamically controls and suppresses the input swing range of an input voltage applied to the RHBD device and concurrently tracks to a clamp voltage which can be a dynamic reference voltage that is automatically correlated and tracked to the input voltage. The dynamic reference voltage can vary by DC voltage variations and/or AC voltage variations due to noise or radiation encountered in outer space. The dynamic reference voltage can be provided to one input of a comparator and/or amplifier circuit where the input voltage is swing-limited and applied to another input of the comparator/amplifier to protect the RHBD device. The swing-limited input voltage is dynamically tracked to the dynamic reference voltage such that a low-voltage RHBD thin-oxide input device operating as a differential pair in the input stage can work within its absolute junction rating. By dynamically tracking the reference voltage while the input voltage is swing-limited to protect the RHBD device, the tracking control module supports the full dynamic range of wider IC applications operating at higher circuit voltages than capable by the lower-voltage RHBD device (e.g., RHBD device employed at input stage of a comparator or amplifier utilized in a pulse-width modulated (PWM) controller application).

In one example, the tracking control module can be implemented as a complimentary metallic oxide (CMOS) transistor-level circuit that protects RHBD devices that utilize lower voltage radiation-hardened thin-oxide transistors (e.g., 1.8V) at the differential input of a comparator and/or amplifier. This enables an IC chip that operates on a higher voltage supply rail (e.g., 5V), where the respective RHBD thin-oxide devices at the input stage of the IC can be easily damaged if their junction voltages were to exceed the factory-specified maximum rating for the device. Also, if the IC operating voltage was limited to the applied input-range (e.g., 1.8V) or lower, this could significantly reduce the dynamic range of the overall IC application (e.g., PWM controller) and thus limit the performance of the respective application. The tracking control module disclosed herein both protects the RHBD device at the input stage from over-voltage swings of the applied input voltage yet also facilitates increased dynamic range of the higher-voltage IC application that receives output from the lower-voltage RHBD device.

The tracking regulator module can be implemented as a system where wide-swing transmission-gates, a tracking regulator module/bias circuit, and a bypass comparator are employed to provide both positive and/or negative input swing protection that can also be incorporated into a circuit module that protects the low-voltage thinner-oxide transistors from electrical overstress. This allows for wide input dynamic range of the input voltage by enabling the module to protect against both high (supply) and low (ground) rails, while also not drawing near zero (or very low current) during the swing-limiting/protective action of the circuit. In addition, the tracking regulator module improves the speed at which the protection mechanisms described herein can engage with small amounts of time-delay. Furthermore, the tracking regulator module can autonomously track the input voltage with respect to the dynamic reference voltage to provide an optimal range of protection thresholds. Moreover, the tracking regulator module employs other protection circuitry to offset or circumvent additional leakage currents caused by total ionizing (TID) radiation encountered in outer space that can lead to over-stress of the thin-oxide transistors.

As used herein, the term "circuit" can include a collection of active and/or passive elements that perform a circuit function, such as an analog circuit and/or digital circuit. Additionally or alternatively, for example, the term "circuit" can include an integrated circuit (IC) where all or some of the circuit elements are fabricated on a common substrate (e.g., semiconductor substrate, such as a die or chip), such as disclosed herein. For example, the tracking control module, RHBD device, PWM controller, and/or other control circuitry may be implemented as a respective IC chip.

FIG. 1 illustrates an example circuit 100 that employs a tracking regulator module 104 to limit input range swings to a radiation hardened by design (RHBD) device 110. As used herein, the term radiation-hardened by design refers to a device that has been designed to withstand radiation or other effects from high-altitude or deployment in outer space. Such RHBD devices 110 often operate at lower device voltages due to radiation-hardening design techniques than the operating voltage of a respective integrated circuit (IC) which they may interface with. The circuit 100 includes the tracking regulator module 104 that receives a clamp threshold voltage 120 the sets a range for voltage swings of a swing-limited output voltage 124. The clamp threshold voltage 120 can be dynamic reference voltage in one example and can vary by DC voltage variations and/or AC voltage variations due to noise and/or radiation encountered in outer space. The tracking regulator module 104 generates the swing-limited output voltage 124 (e.g., positive or negative limiting) to mitigate over-voltage swings of an input voltage VIN 128.

The tracking regulator module 104 includes a regulation module 130 having a threshold input 134 to receive the clamp threshold voltage 120 and a feedback input 138 to monitor the swing-limited output voltage 124. The regulation module 130 generates a difference signal 140 that indicates a difference between the clamp threshold voltage 120 and the swing-limited output voltage 124. A current compensation module 144 includes a clamp port 146 and an input port 148. The clamp port 146 controls the swing-limited output voltage 124 and the input port 148 receives the difference signal 140. The clamp port 146 generates an adjustment current 150 to control the swing-limited output voltage 124 based on the difference signal 140. An adjustment network 154 receives the input voltage VIN 128 and the adjustment current 150 from the clamp port 146. The adjustment current 150 generates a voltage across the adjustment network 154 such that the swing-limited output voltage 124 at the clamp port 146 is adjusted within a voltage range of the input voltage VIN 128.

In an example, the adjustment network 154 includes a resistor network to receive the adjustment current 150 and generate the voltage across the adjustment network such that the swing-limited output voltage 124 at the clamp port 146 is adjusted within a voltage range of the input voltage 128. The regulation module 130 can include a differential amplifier (see e.g., FIG. 4) to receive the clamp threshold voltage 120 at one input and the feedback input 138 to monitor the swing-limited output voltage 124 where the output of the differential amplifier provides the difference signal 140. A bias module (see e.g., FIG. 4) provides bias current to the differential amplifier based on the clamp threshold voltage 120. The current compensation module 144 can include a transconductance amplifier (see e.g., FIG. 4) to convert the difference signal 140 to the adjustment current 150. As shown, the current compensation module 144 includes a source port 156 to receive the input voltage 128 from an input voltage source (not shown). The current compensation module 144 provides compensation current 158 in response to the difference signal 140 to compensate for current drawn from the input voltage source and thus mitigates loading of the input source.

The RHBD device 110 includes a device input 164 to receive the swing-limited output voltage 124 from the tracking regulator module 104. The RHBD device 110 is part of an input stage 166 that includes a reference input (not shown) that receives the clamp threshold voltage 120. In an example, the input stage 166 could be a comparator or an amplifier stage that generates an output 170 based on the voltage relationship between the device input 164 and the reference input at the input stage (e.g., if device input 164 has a higher voltage than the reference input, the output 170 swings positive). The RHBD device 110 is operatively coupled to an integrated circuit (IC) 174. The RHBD device 110 operates at a device voltage (VDEV) (e.g., 1.8V) that is less than an operating voltage (VDD) (e.g., 5V) of the IC 174. The IC 174 includes a comparator circuit or an amplifier circuit in the input stage 166 that receives the clamp threshold voltage 120 at the reference input and the swing-limited output voltage 124 at the device input 164. The comparator circuit or the amplifier circuit of the input stage 166 generates the output signal 170 based on the swing-limited output voltage's 124 relationship to the clamp threshold voltage 120. The output signal 170 can be employed by the IC 174 to regulate a control loop (or loops) that includes, for example, a pulse width modulated (PWM) control loop. An example system showing a comparator for the input stage 166 and a PWM controller as the IC 174 is illustrated and described below with respect to FIG. 3.

Figure 2:
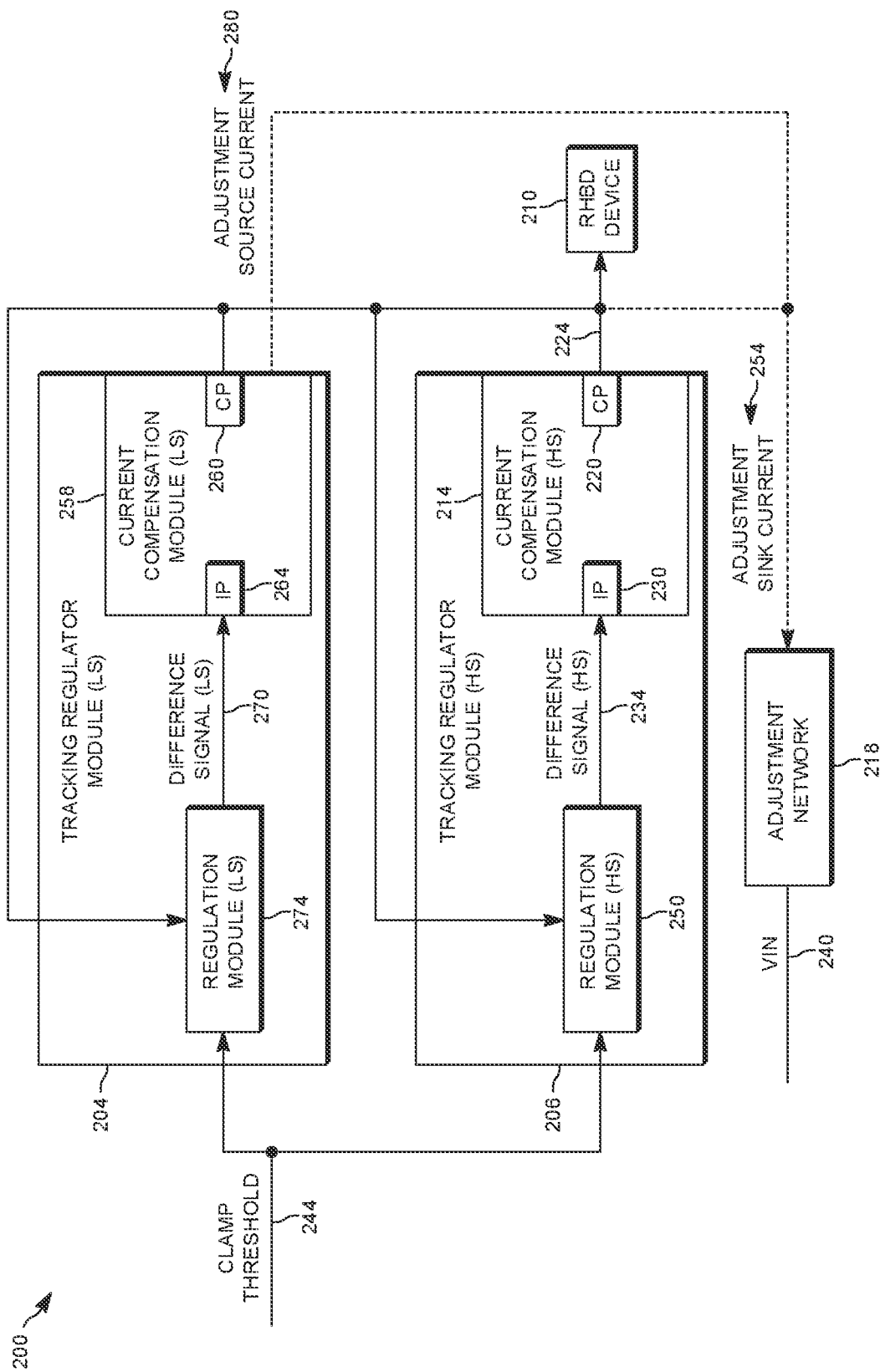
FIG. 2 illustrates a block diagram of an example circuit that employs low-side and high-side tracking regulator modules and adjustment network to limit positive and negative input range swings to a radiation hardened by design device.

FIG. 2 illustrates an example system 200 that employs low-side and high-side tracking regulator modules 204 and 206 and adjustment network 218 to limit positive and negative input range swings to a radiation hardened by design device 210. The system 200 includes an integrated circuit (IC) (not shown) that includes the radiation hardened by design (RHBD) device 210 having a device input. The RHBD device 210 is operatively coupled to the IC (see, e.g., FIG. 1) and operates at a device voltage (VDEV) that is less than an operating voltage (VDD) of the IC. A first tracking regulator module 206, also referred to as high side tracking regulator module, includes a current compensation module 214 having a first clamp port 220 that controls a swing-limited output voltage 224 and a first input port 230 coupled to receive a first difference signal 234 that indicates a difference between an input voltage 240 and a threshold voltage 244. A regulation module 250 generates the difference signal based of the clamp threshold voltage 244 and the swing-limited output voltage 224.

The first clamp port 220 generates an adjustment sink current 254 to control the swing-limited output voltage based on the first difference signal 234 indicating the input voltage 240 is detected above the threshold voltage 244. A second tracking regulator module 204, also referred to as low side tracking regulator module, includes a current compensation module 258 having a second clamp port 260 that controls the swing-limited output voltage 224 and a second input port 264 coupled to receive a second difference signal 270 that indicates a difference between the input voltage 240 and the threshold voltage 244. The second difference signal 270 is generated by regulation module 274. The second clamp port 260 generates an adjustment source current 280 to control the swing-limited output voltage 224 based on the second difference signal 270 indicating the input voltage is detected below the threshold voltage 244. The adjustment network 218 receives the input voltage 240 and the adjustment current from the first clamp port 220 and the second clamp port 260. The adjustment current 254 or 280 generates a voltage across the adjustment network 218 such that the swing-limited output voltage 224 at the first clamp port 220 and the second clamp port 260 is adjusted within a voltage range of the input voltage 240.

As will be illustrated and described below with respect to FIG. 5, the first tracking regulator module 206 includes a first differential amplifier to receive the clamp threshold voltage 244 at one input and a feedback input to monitor the swing-limited output voltage 224. The second tracking regulator module 204 includes a second differential amplifier to receive the clamp threshold voltage 244 at one input and a feedback input to monitor the swing-limited output voltage 224. The output of the first differential amplifier provides the first difference signal 234 and the output of the second differential amplifier provides the second difference signal 270.

Figure 3:
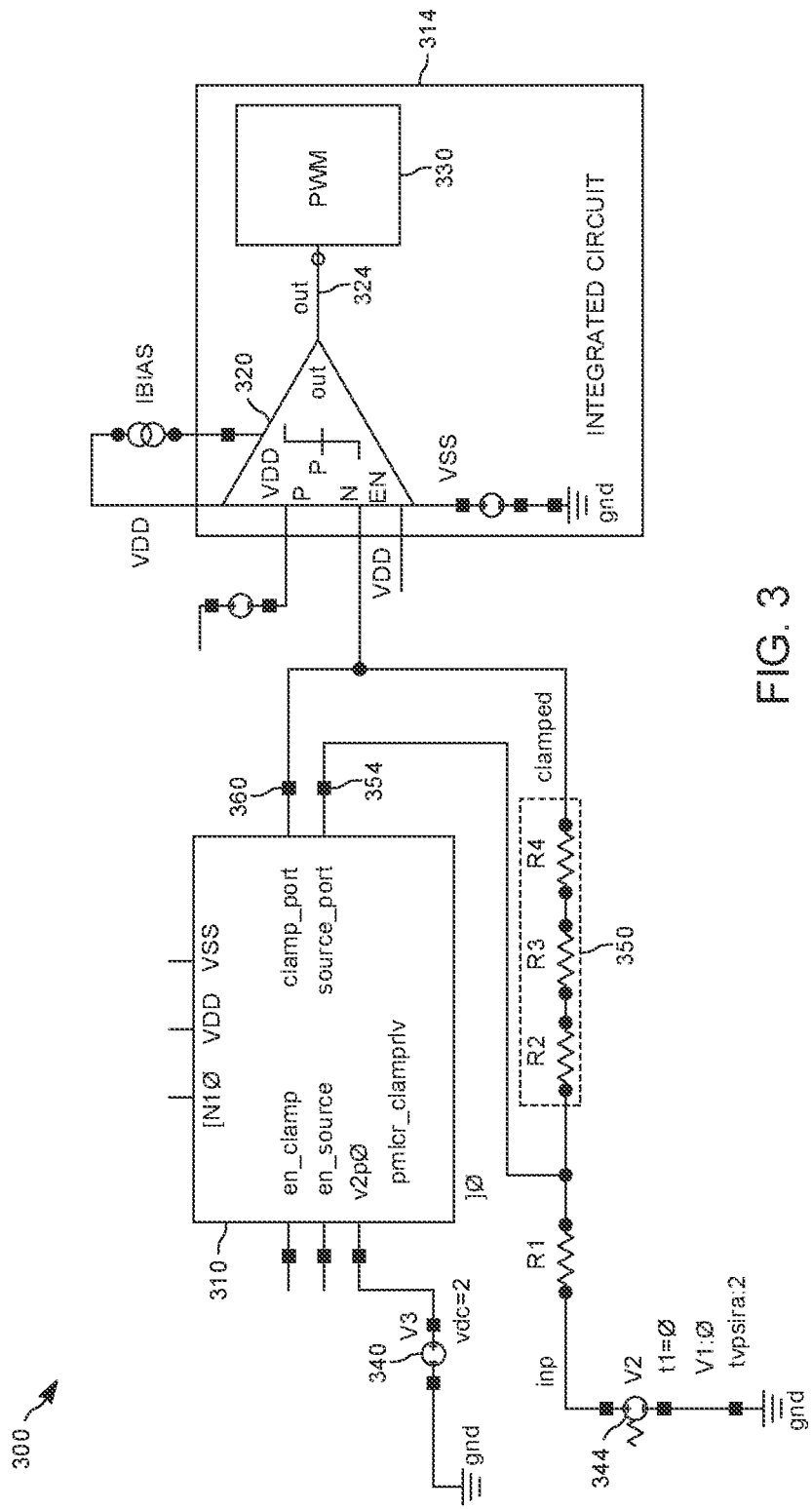
FIG. 3 illustrates an example system that employs a tracking regulator module integrated circuit and adjustment network to limit input range swings to an integrated circuit (IC) that employs a radiation hardened by design device at the input to the IC.

FIG. 3 illustrates an example system 300 that employs a tracking regulator module 310 to limit input range swings to an integrated circuit (IC) 314 that employs a radiation hardened by design device at the input to the IC. In this example, the RHBD device is not shown but is integrated at a P-input of a comparator 320 which operates as the input stage of the IC 314 (similar to input stage 166 of FIG. 1). In this example, output 324 of the comparator 320 feeds a pulse width modulated (PWM) circuit 330 (e.g., to regulate an output voltage based on comparator output); however, other applications are possible, as mentioned above with respect to FIG. 1. As mentioned previously, the RHBD device in the comparator 320 is operatively coupled to the IC and operates at a device voltage (VDEV) that is less than an operating voltage (VDD) of the IC. As shown, the comparator 320 receives operating voltages VDD, VSS, and operating current from current source IBIAS.

The tracking regulator module 310 includes enable inputs en_clamp and en_source which operate to enable and disable circuits within the module for testing purposes. Such enable operations and inputs are shown with respect to FIG. 4. The tracking regulator module 310 receives clamp threshold voltage from source 340 which is received at input labeled $v2p0$, which represents a clamp voltage of 2.0 volts in this example, but other clamp voltage settings are possible. An input voltage source 344 drives input resistor R1 which is coupled to adjustment network 350 and source port 354. A clamp port 360 of the tracking control module 310 is connected to the other side of the adjustment network 350. In this example, the adjustment network 350 includes network resistors R2, R3, and R4, which are coupled in series inside the network. As shown, the tracking regulator module 310 receives input sources VDD, VSS, and IBIAS to operate the module.

Figure 4:
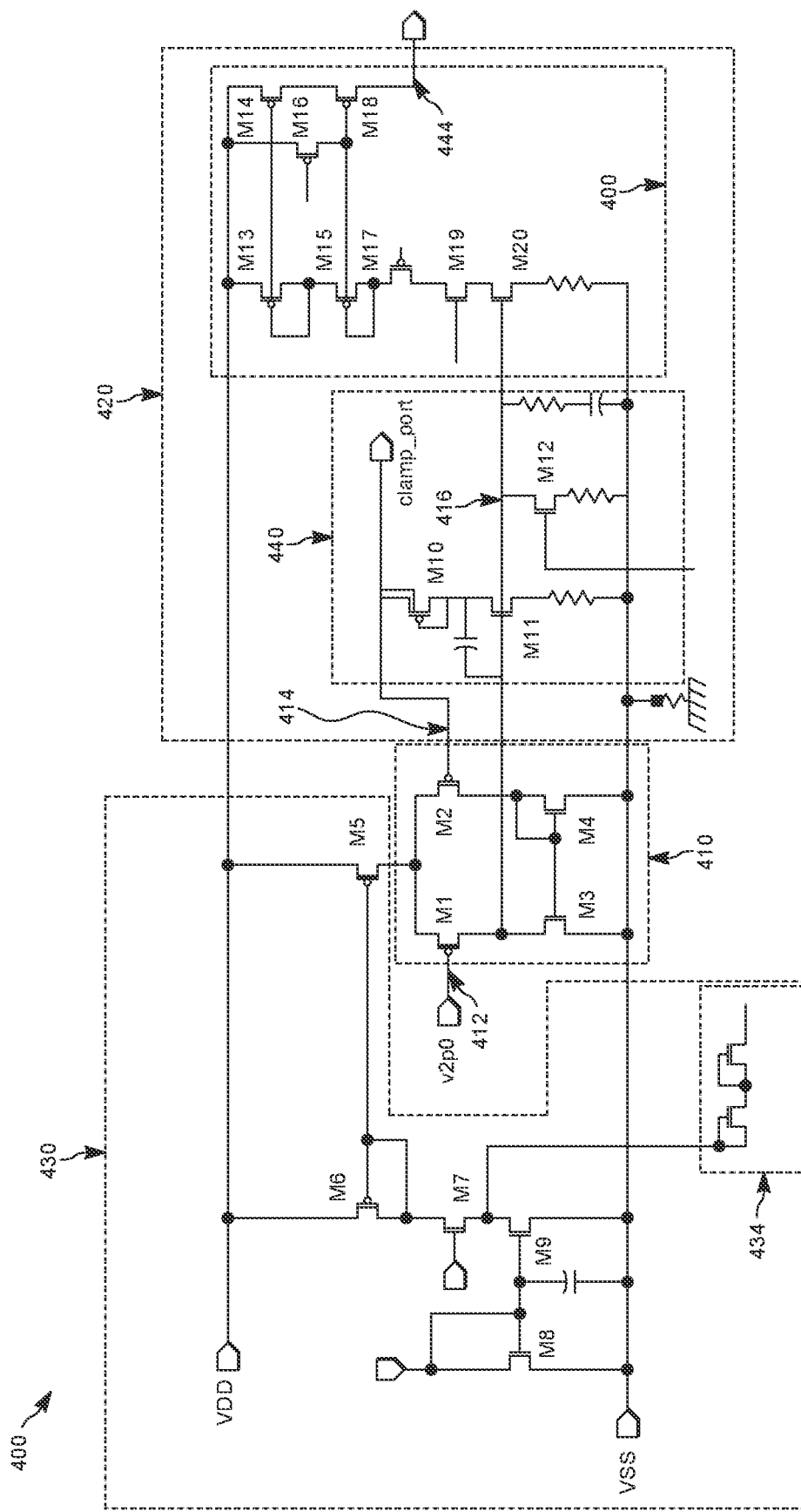
FIG. 4 illustrates an example circuit of a tracking regulator module to limit positive input range swings to a radiation hardened by design device.

FIG. 4 illustrates an example of a tracking regulator module 400 to limit positive input range swings to a radiation hardened by design device. The tracking regulator module includes a regulation module having a threshold input 412 to receive a clamp threshold voltage shown as $v2p0$ and a feedback input 414 to monitor a swing-limited output voltage at a node labeled clamp_port. The regulation module 410 generates a difference signal 416 that indicates a difference between the clamp threshold voltage at 412 and the swing-limited output voltage at clamp_port. A current compensation module 420 includes the clamp port and an input port tied to a gate of M11 and M20 and driven by difference signal 416. The clamp port controls the swing-limited output voltage and the input port receives the difference signal 416. The clamp port generates an adjustment current to control the swing-limited output voltage based on the difference signal 416. An adjustment network (not shown) receives an input voltage and the adjustment current from the clamp port. The adjustment current generates a voltage across the adjustment network such that the swing-limited output voltage at the clamp port is adjusted within a voltage range of the input voltage.

The regulation module 410 includes a differential amplifier that includes M1 and M2 which are coupled respectively to M3 and M4. The differential amplifier receives the clamp threshold voltage at one input 412 and a feedback input 414 to monitor the swing-limited output voltage. The output of the differential amplifier at M1 provides the difference signal 416. A bias module 430 provides bias current to the differential amplifier based on the clamp threshold voltage. The bias module 430 includes transistor M5 to drive the differential amplifier of M1 and M2. Transistor M5 mirrors M6 which is coupled in series to M7 and M9. M7 receives $v2p0$ to set the bias current. Transistor M8 mirrors M9. A circuit 434 is provided to limit voltages seen by M7 and M9 due to radiation from space.

The current compensation module 420 includes a transconductance amplifier 440 to convert the difference signal 416 to the adjustment current. The transconductance amplifier 440 includes M10 which is coupled to the clamp port and the feedback input 414. Transistor M10 drives transistors M11 and M12. As shown, the current compensation module 420 includes a source port 414 to receive the input voltage from an input voltage source (not shown). The current compensation module 420 provides compensation current in response to the difference signal to compensate for current drawn from the input voltage source. The compensation current is provided by transistors M13, M14, M15, and M16 in response to difference signal 416 which drives transistor M20 and clamp threshold $v2p0$ which drives transistor M19. Transistors M16 and M17 are provided for testing purposes and allow selective enabling or disabling of circuits in the current compensation module 420.

Figure 5:
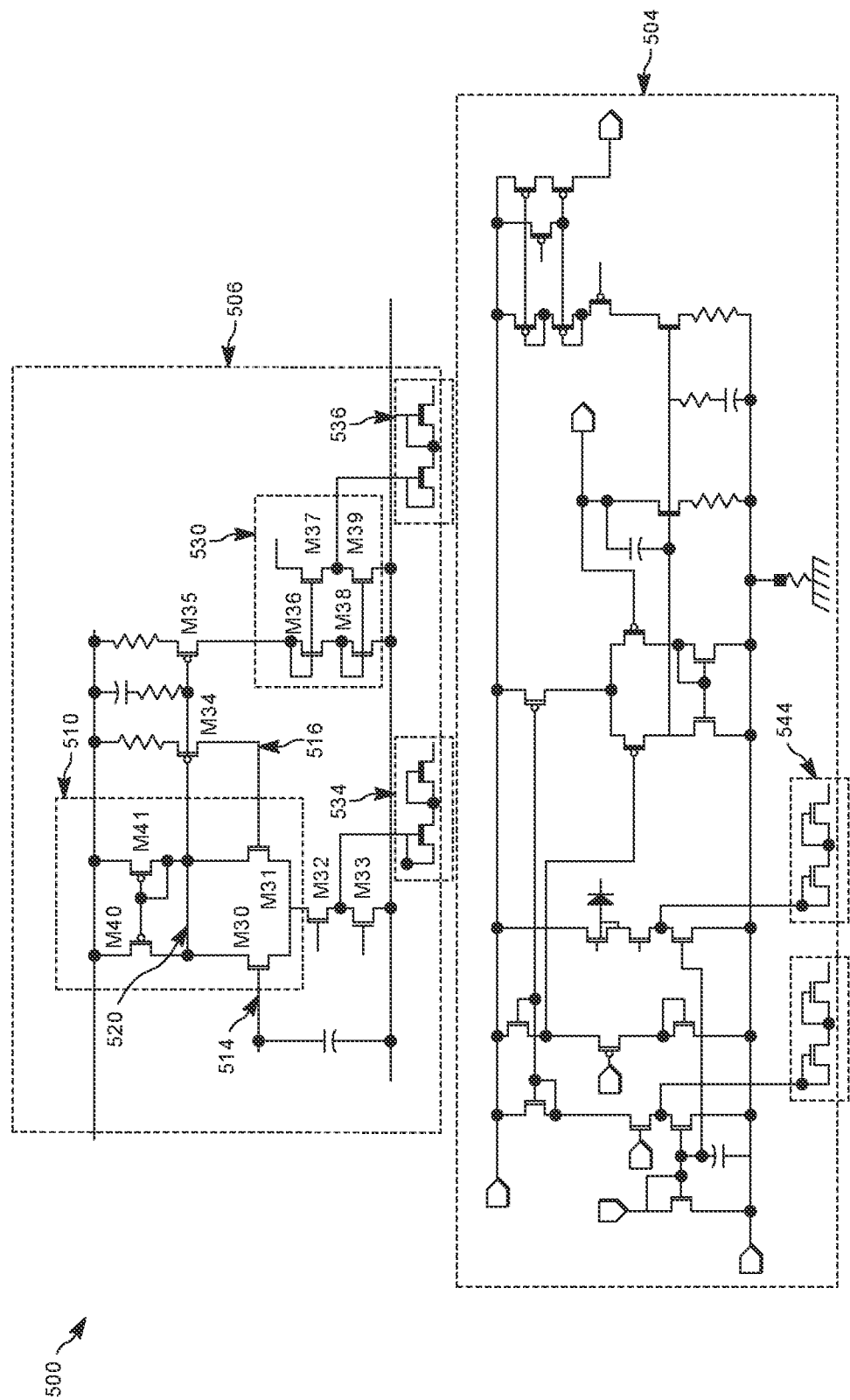
FIG. 5 illustrates an example circuit that employs low-side and high-side tracking regulator modules to limit positive and negative input range swings to a radiation hardened by design device.

FIG. 5 illustrates an example circuit 500 that employs low-side and high-side tracking regulator modules to limit positive and negative input range swings to a radiation hardened by design device. A high-side tracking regulator module 504 is provided to generate sink adjustment current in response to input voltages that exceed the clamp threshold voltages and a low-side tracking regulator module 506 is provided to generate adjustment source current in response to input voltages that are too far below the clamp threshold voltage described herein. The high-side tracking regulator module 504 was described above with respect to the circuit 400 of FIG. 4 and therefore will not be described with respect to FIG. 5 for purposes of brevity.

The low-side tracking control module 506 includes regulation module 510 that includes differential amplifier M30 and M31 which are biased from M32 and M33. Clamp threshold voltage 514 drives M30 and the clamp input 516 drives the gate of M31. Transistors M40 and M41 are coupled to M30 and M31 respectively to provide a bias path for the transistors. A difference signal 520 is fed to transconductance amplifier M34 and M35 which drive compensation circuit 530 to generate compensation source current as described herein. The compensation circuit 530 includes transistors M36, M37, M38, and M39, with M36 and M38 being series connected and M37 and M39 also being series connected. Circuits 534, 536, 540, and 544 are provided to limit over-voltage stresses due to radiation noise encountered in space.

FIGS. 6 through 9 illustrate example waveform diagrams 600, 700, 800, and 900 respectively for the tracking regulator modules depicted in FIGS. 4 and 5 showing various swing-limited output voltage ranges in response to different input voltages. Voltage in volts is represented on the vertical axis of the respective diagrams and time in microseconds is represented on the horizontal axis of the respective diagrams.

Figure 6:
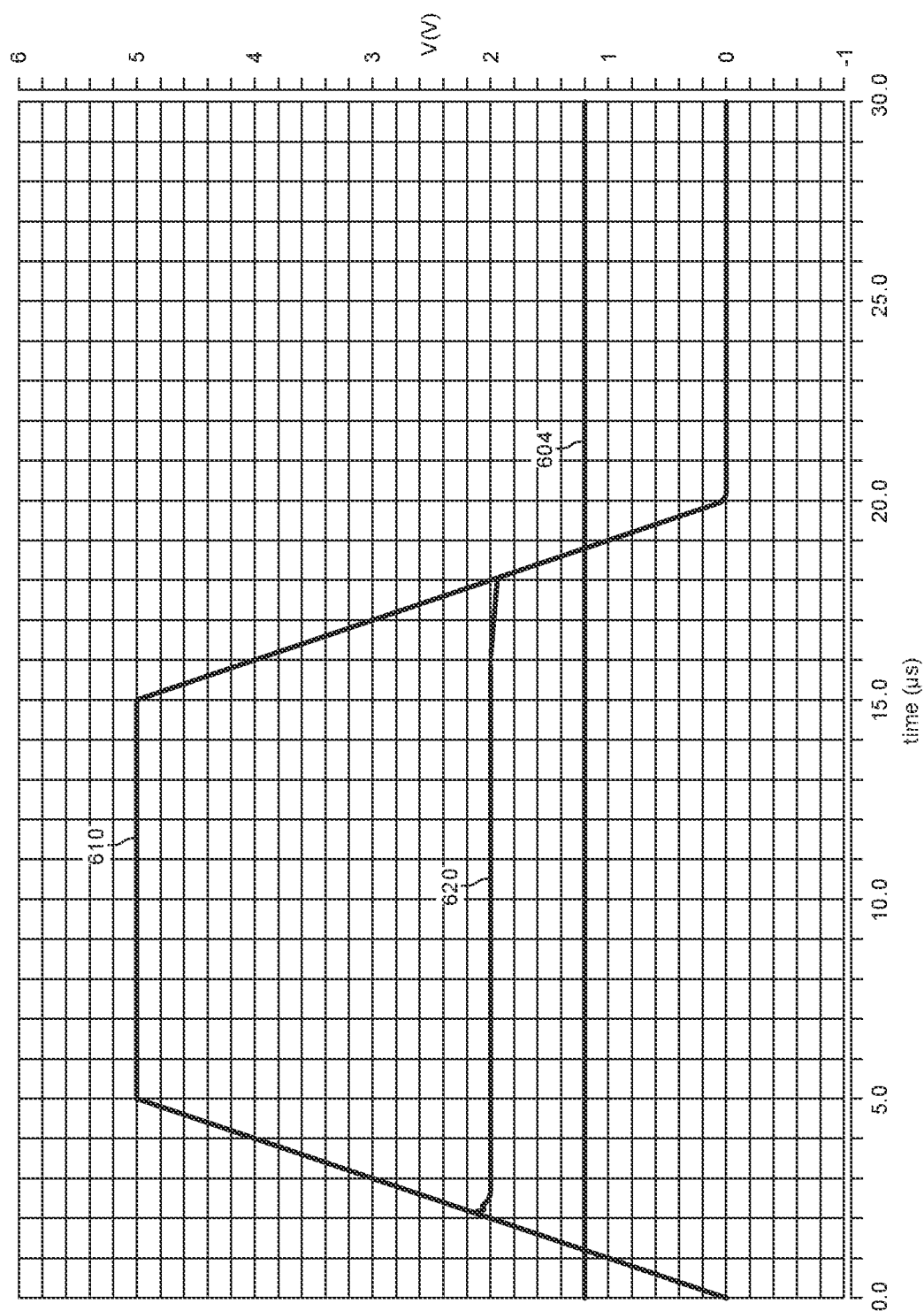
FIGS. 6 through 9 illustrate example waveform diagrams for the closed loop controls showing various swing-limited output voltage ranges in response to different input voltages.

With respect to FIG. 6, a reference voltage 604 (e.g., clamp threshold voltage) is set at about 1.2 V. An input voltage 610 swings from about 0 V to about 5 V and back to about 0 V in a period of about 20.0 microseconds. As shown, a swing-limited output is generated at 620, which is limited to about 2.0 V. The waveform 600 was generated with respect to the circuit of FIG. 4 which provides high-side clamping whereas the waveforms 700, 800, and 900 provide high and low side clamping as described below.

Figure 7:
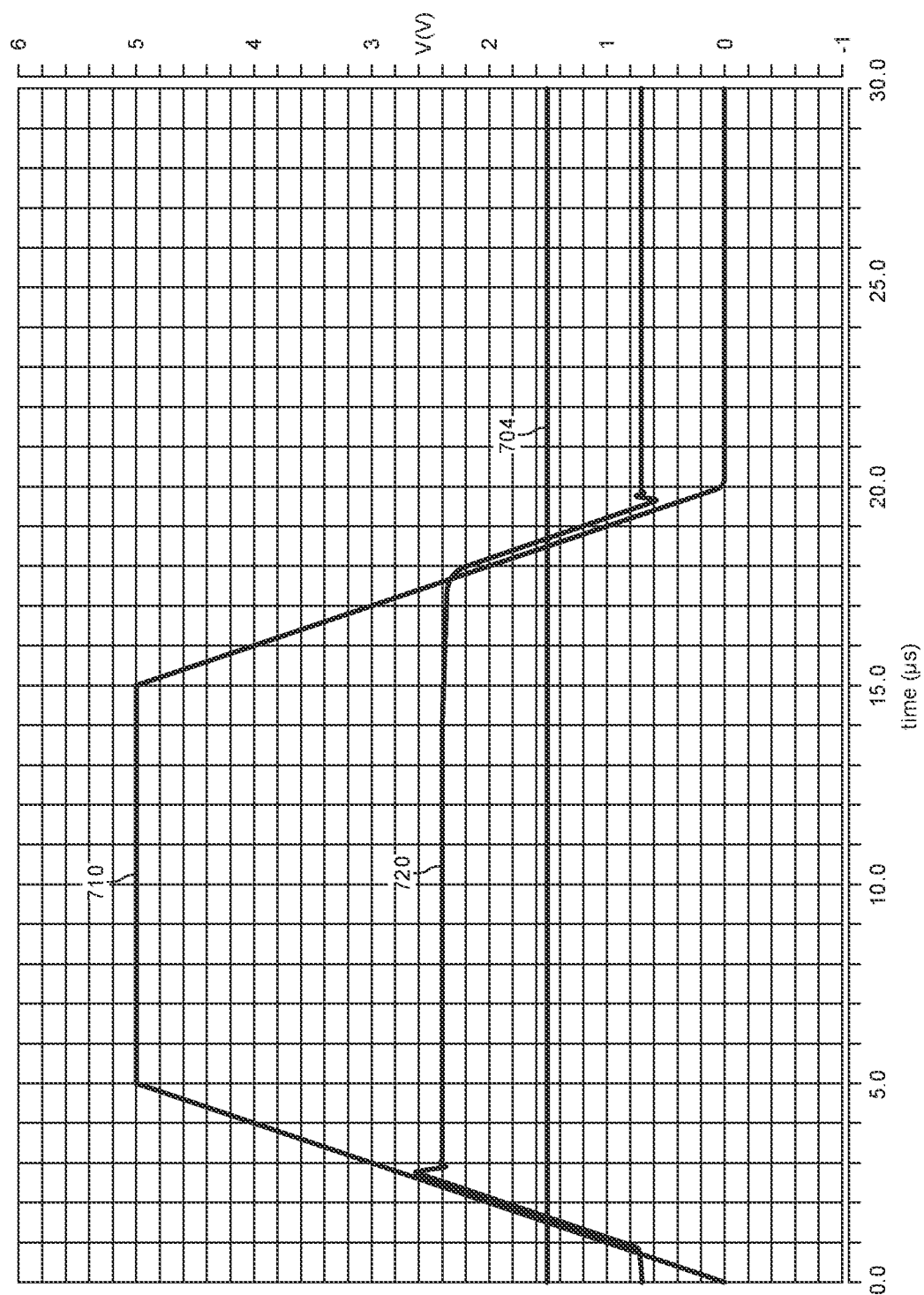

With respect to FIG. 7, a reference voltage 704 (e.g., clamp threshold voltage) is set at about 1.5 V. An input voltage 710 swings from about 0 V to about 5 V and back to about 0 V in a period of about 20.0 microseconds. As shown, a swing-limited output is generated at 720, which is limited to about 2.4 V on the high side and 0.7 V on the low side.

Figure 8:
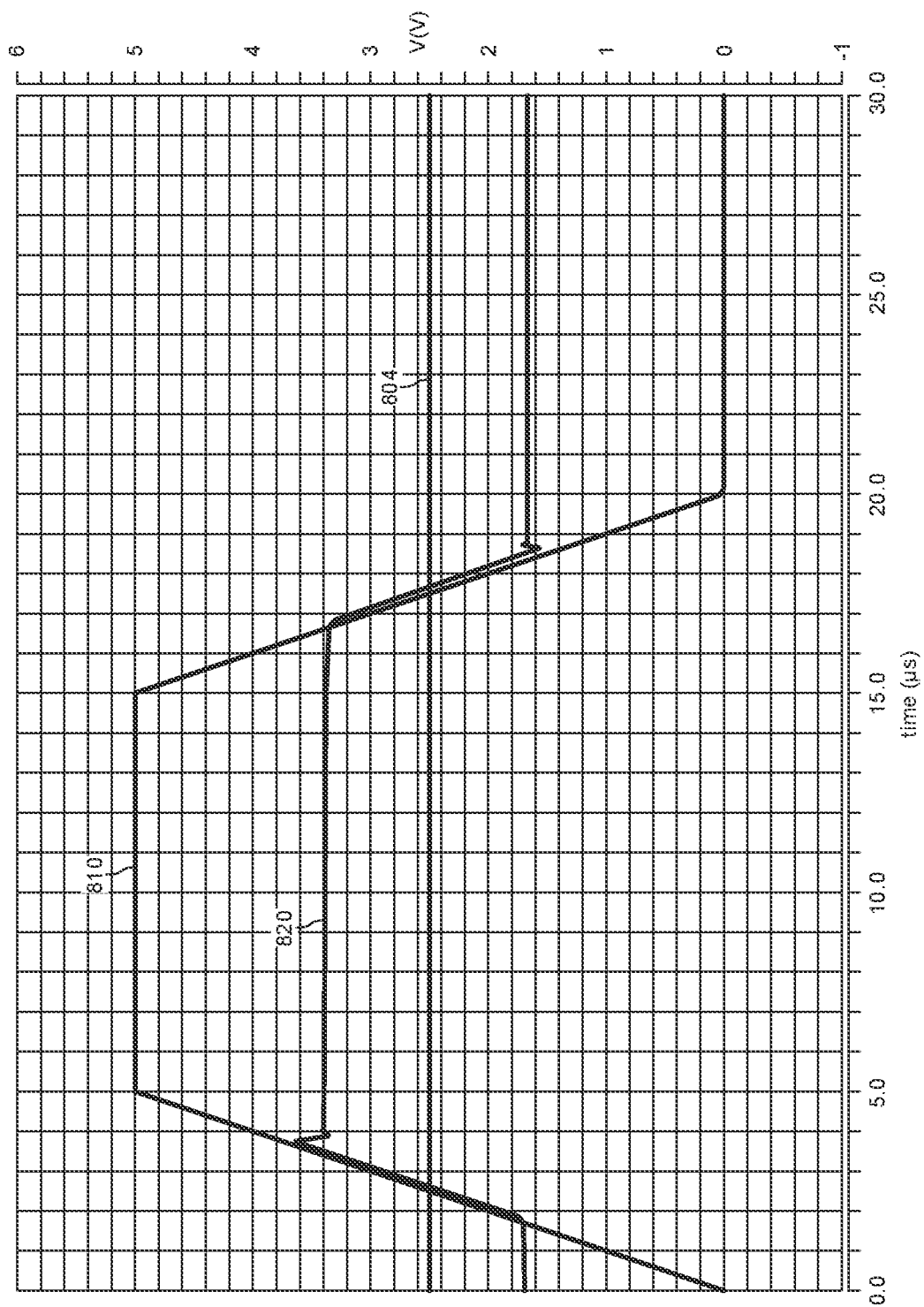

With respect to FIG. 8, a reference voltage 804 (e.g., clamp threshold voltage) is set at about 2.5 V. An input voltage 810 swings from about 0 V to about 5 V and back to about 0 V in a period of about 20.0 microseconds. As shown, a swing-limited output is generated at 820, which is limited to about 3.4 V on the high side and 1.5 V on the low side.

Figure 9:
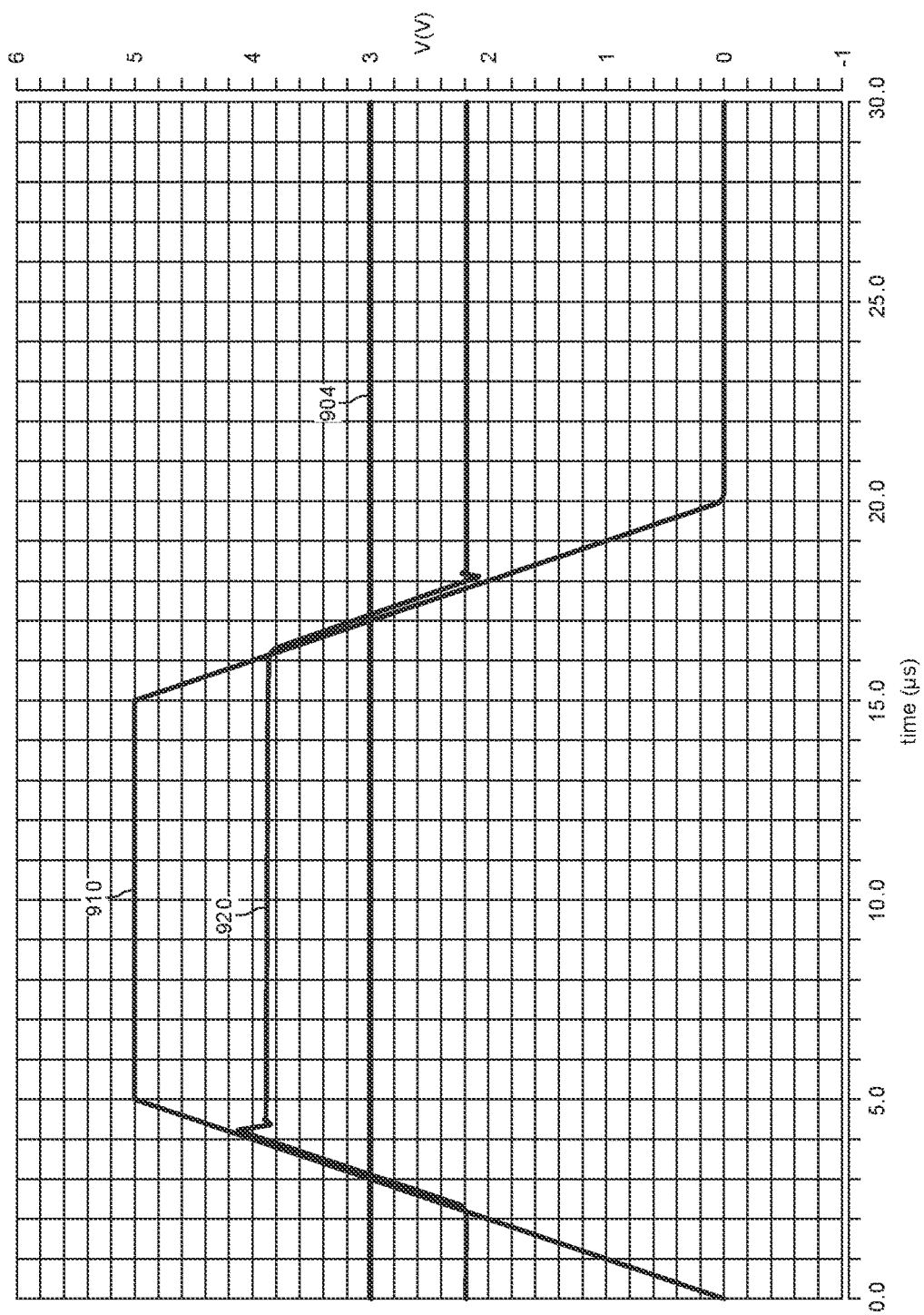

With respect to FIG. 9, a reference voltage 904 (e.g., clamp threshold voltage) is set at about 3.0 V. An input voltage 910 swings from about 0 V to about 5 V and back to about 0 V in a period of about 20.0 microseconds. As shown, a swing-limited output is generated at 920, which is limited to about 3.8 V on the high side and 2.2 V on the low side.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit in a radiation hardened by design (RHBD) system, the circuit comprising:
    a regulation module having a threshold input configured to receive a clamp threshold voltage and a voltage feedback input configured to monitor a dynamic time-varying swing-limited output voltage within the RHBD system, the regulation module being configured to generate a difference signal that indicates a difference between the clamp threshold voltage and the dynamic time-varying swing-limited output voltage;
    a current compensation module having a clamp port and an input port, the clamp port being configured to control the dynamic time-varying swing-limited output voltage and the input port being configured to receive the difference signal, the clamp port being configured to generate an adjustment current configured to control the dynamic time-varying swing-limited output voltage based on the difference signal; and
    a passive adjustment network configured to receive a dynamic time-varying input voltage and the adjustment current from the clamp port, the adjustment current being configured to generate a voltage across the adjustment network such that the dynamic time-varying swing-limited output voltage at the clamp port is adjusted within a voltage range of the dynamic time-varying input voltage.

2. The circuit of claim 1, further comprising an radiation hardened by design (RHBD) device having a device input configured to receive the dynamic time-varying swing-limited output voltage from the current compensation module, the RHBD device being operatively coupled to an integrated circuit (IC), the RHBD device being configured to operate at a device voltage (VDEV) that is less than an operating voltage (VDD) of the IC.

3. The circuit of claim 2, wherein the IC includes a comparator circuit or an amplifier circuit configured to receive the dynamic time-varying swing-limited output voltage, the comparator circuit or the amplifier circuit being configured to generate an output signal based on a relationship of the dynamic time-varying swing-limited output voltage to the clamp threshold voltage, and wherein the IC is configured to employ the output signal to regulate a control loop that includes a pulse width modulated (PWM) control loop.

4. The circuit of claim 3, wherein the clamp threshold voltage is a dynamic voltage that includes positive or negative voltage swings from a base voltage setting of the clamp threshold voltage.

5. The circuit of claim 1, wherein the passive adjustment network includes a resistor network configured to receive the adjustment current and to generate the voltage across the adjustment network such that the dynamic time-varying swing-limited output voltage at the clamp port is adjusted within the voltage range of the input voltage.

6. The circuit of claim 1, wherein the regulation module includes a differential amplifier configured to receive the clamp threshold voltage at one input and the feedback input to monitor the dynamic time-varying swing-limited output voltage, and wherein the output of the differential amplifier is configured to provide the difference signal.

7. The circuit of claim 6, further comprising a bias module configured to provide bias current to the differential amplifier based on the clamp threshold voltage.

8. The circuit of claim 6, wherein the current compensation module includes a transconductance amplifier configured to convert the difference signal to the adjustment current.

9. The circuit of claim 8, wherein the current compensation module includes a source port configured to receive the dynamic time-varying input voltage from an input voltage source, and wherein the current compensation module is configured to provide compensation current in response to the difference signal to compensate for current drawn from the input voltage source.

10. The circuit of claim 1, wherein the regulation module and the current compensation module are configured as a first tracking control module configured to limit at least one of positive or negative voltage swings of the input voltage at the clamp port.

11. The circuit of claim 10, further comprising a second tracking control module configured to provide adjustment source current during negative swings of the input voltage that exceed the clamp threshold voltage, wherein the first tracking control module is configured to provide adjustment sink current during positive swings of the input voltage that exceed the clamp threshold voltage.

12. A circuit, comprising:
an integrated circuit (IC) that includes a radiation hardened by design (RHBD) device having a device input, the RHBD device being operatively coupled to the IC and being configured to operate at a device voltage (VDEV) that is less than an operating voltage (VDD) of the IC;
a first tracking control module having a threshold input configured to receive a clamp threshold voltage and having a voltage feedback input configured to monitor a dynamic time-varying swing-limited output voltage, the first tracking control module being configured to generate a difference signal that indicates a difference between the clamp threshold voltage and the dynamic time-varying swing-limited output voltage, the first tracking control module including a clamp port and an input port, the clamp port being configured to control the dynamic time-varying swing-limited output voltage and the input port being configured to receive the difference signal, the clamp port being configured to generate an adjustment current to control the dynamic time-varying swing-limited output voltage based on the difference signal; and
a passive adjustment network configured to receive a dynamic time-varying input voltage and the adjustment current from the clamp port, the adjustment current being configured to generate a voltage across the adjustment network such that the dynamic time-varying swing-limited output voltage at the clamp port is adjusted within a voltage range of the dynamic time-varying input voltage.

13. The circuit of claim 12, wherein the adjustment network includes a resistor network configured to receive the adjustment current and to generate the voltage across the adjustment network such that the dynamic time-varying swing-limited output voltage at the clamp port is adjusted within the voltage range of the input voltage.

14. The circuit of claim 12, wherein the first tracking control module includes a differential amplifier configured to receive the clamp threshold voltage at one input and the feedback input to monitor the swing-limited output voltage, and wherein the output of the differential amplifier is configured to provide the difference signal.

15. The circuit of claim 14, further comprising a bias module configured to provide bias current to the differential amplifier based on the clamp threshold voltage.

16. The circuit of claim 14, wherein the first tracking control module includes a transconductance amplifier configured to convert the difference signal to the adjustment current.

17. The circuit of claim 16, wherein the first tracking control module includes a source port configured to receive the input voltage from an input voltage source, and wherein the first tracking control module is configured to provide compensation current in response to the difference signal to compensate for current drawn from the input voltage source.

18. The circuit of claim 17, further comprising a second tracking control module configured to provide adjustment source current during negative swings of the input voltage that exceed the clamp threshold voltage, wherein the first tracking control module is configured to provide adjustment sink current during positive swings of the input voltage that exceed the clamp threshold voltage.

19. A system, comprising:
an integrated circuit (IC) that includes a radiation hardened by design (RHBD) device having a device input, the RHBD device being operatively coupled to the IC and being configured to operate at a device voltage (VDEV) that is less than an operating voltage (VDD) of the IC;
a first tracking control module having a first clamp port configured to control a dynamic time-varying swing-limited output voltage, a first current compensation module within the first tracking control module, and a first input port to the first current compensation module coupled to a first regulation module within the first tracking control module to receive a first difference signal that indicates a difference between a dynamic time-varying input voltage and a threshold voltage, the first clamp port being configured to generate an adjustment sink current to control the dynamic time-varying swing-limited output voltage based on the first difference signal indicating the dynamic time-varying input voltage is detected above the threshold voltage;
a second tracking control module having a second clamp port configured to control the dynamic time-varying swing-limited output voltage, a second current compensation module within the second tracking control module, and a second input port to the second current compensation module coupled to a second regulation module within the second tracking control module to receive a second difference signal that indicates a difference between the dynamic time-varying input voltage and the threshold voltage, the second clamp port being configured to generate an adjustment source current to control the dynamic time-varying swing-limited output voltage based on the second difference signal indicating the dynamic time-varying input voltage is detected below the threshold voltage; and
a passive adjustment network configured to receive the dynamic time-varying input voltage and the adjustment current from the first clamp port and the second clamp port, the adjustment current being configured to generate a voltage across the adjustment network such that the dynamic time-varying swing-limited output voltage at the first clamp port and the second clamp port is adjusted within a voltage range of the dynamic time-varying input voltage.

20. The system of claim 19, wherein the first tracking control module includes a first differential amplifier to receive the clamp threshold voltage at a first input and a first voltage feedback input configured to monitor the dynamic time-varying swing-limited output voltage,
wherein the second tracking control module includes a second differential amplifier to receive the clamp threshold voltage at a second input and a second voltage feedback input configured to monitor the dynamic time-varying swing-limited output voltage,
wherein a first output of the first differential amplifier is configured to provide the first difference signal, and
wherein a second output of the second differential amplifier is configured to provide the second difference signal.

* * * * *